US009726329B2

(12) United States Patent
Matsuo et al.

(10) Patent No.: US 9,726,329 B2
(45) Date of Patent: Aug. 8, 2017

(54) LIGHT SOURCE APPARATUS

(71) Applicant: NICHIA CORPORATION, Anan-shi, Tokushima (JP)

(72) Inventors: Hidenori Matsuo, Hadano (JP); Takashi Sasamuro, Yamato (JP); Hideki Kondo, Yokohama (JP)

(73) Assignee: Nichia Corporation, Anan-shi (JP)

( * ) Notice: Subject to any disclaimer, the term of this patent is extended or adjusted under 35 U.S.C. 154(b) by 264 days.

(21) Appl. No.: 14/257,523

(22) Filed: Apr. 21, 2014

(65) Prior Publication Data

US 2014/0313715 A1    Oct. 23, 2014

(30) Foreign Application Priority Data

Apr. 22, 2013 (JP) ................................ 2013-089501
Jul. 19, 2013 (JP) ................................ 2013-150836
Apr. 14, 2014 (JP) ................................ 2014-082560

(51) Int. Cl.
*F21K 5/00*      (2006.01)
*F21K 9/00*      (2016.01)
(Continued)

(52) U.S. Cl.
CPC .................. *F21K 9/00* (2013.01); *H01S 5/02* (2013.01); *H01S 5/0202* (2013.01);
(Continued)

(58) Field of Classification Search
CPC ........ F21K 9/00; H01L 23/055; H01L 23/057
(Continued)

(56) References Cited

U.S. PATENT DOCUMENTS 5,617,439 A *  4/1997  Kakimoto ............. H01S 5/0264
                                              257/84
7,653,109 B2 *  1/2010  Bischel ................ G02B 6/4201
                                              156/212
(Continued)

FOREIGN PATENT DOCUMENTS

JP    H10-116943 A        5/1998
JP    2004325929 A  *  11/2004
(Continued)

OTHER PUBLICATIONS

Extended European Search Report of the corresponding European Patent Application No. 14165456.6, dated Feb. 10, 2015.

*Primary Examiner* — Sean Gramling
*Assistant Examiner* — Gerald J Sufleta, II
(74) *Attorney, Agent, or Firm* — Global IP Counselors, LLP

(57) ABSTRACT

A light source apparatus of the present invention has a plurality of semiconductor laser devices and a holding member; the semiconductor laser device includes: a semiconductor laser element; a placing body on which the semiconductor laser element is mounted; a substrate on which the placing body is biased to one side thereof; and a pair of terminals electrically connected to the semiconductor laser element, biased to the other side of the substrate and protruding from the substrate, and the holding member includes: holes aligned in at least a pair of rows; a thin-walled section on which the holes are arranged, the thin-walled section being formed by providing at least a pair of depressions on the other side; and a thick-walled section provided adjacent to the thin-walled section. The semiconductor laser device is mounted on one side of the holding member and the placing body of the semiconductor laser device is disposed on the thick-walled section, and the pair of terminals are exposed through the holes from the other side of the holding member.

17 Claims, 9 Drawing Sheets

(51) Int. Cl.
*H01S 5/02* (2006.01)
*G03B 21/20* (2006.01)
*H01S 5/024* (2006.01)
*H01S 5/40* (2006.01)

(52) U.S. Cl.
CPC ...... *G03B 21/2033* (2013.01); *H01S 5/02469* (2013.01); *H01S 5/4025* (2013.01)

(58) Field of Classification Search
USPC ........................................ 372/24, 26, 50.12
See application file for complete search history.

(56) References Cited

U.S. PATENT DOCUMENTS

| | | |
|---|---|---|
| 2005/0111503 A1 | 5/2005 | Ishigami et al. |
| 2006/0180823 A1 | 8/2006 | Yasui |
| 2007/0053392 A1 | 3/2007 | Moto |
| 2009/0190099 A1 | 7/2009 | Takahashi et al. |
| 2012/0287954 A1* | 11/2012 | Saruwatari .......... H01S 5/02469 372/34 |
| 2012/0327377 A1 | 12/2012 | Ohsugi |
| 2013/0038841 A1 | 2/2013 | Zakoji et al. |
| 2013/0050663 A1 | 2/2013 | Hayashi |
| 2013/0208753 A1* | 8/2013 | van Leeuwen ......... H01S 5/423 372/72 |
| 2013/0265727 A1* | 10/2013 | Segawa .................. H05K 1/183 361/748 |

FOREIGN PATENT DOCUMENTS

| | | |
|---|---|---|
| JP | 2009-08-06 A | 8/2009 |
| JP | 2009-175426 A | 8/2009 |
| JP | 2012-009760 A | 1/2012 |
| JP | 2013-008555 A | 1/2013 |
| JP | 2013-037216 A | 2/2013 |
| JP | 2013-051126 A | 3/2013 |

* cited by examiner

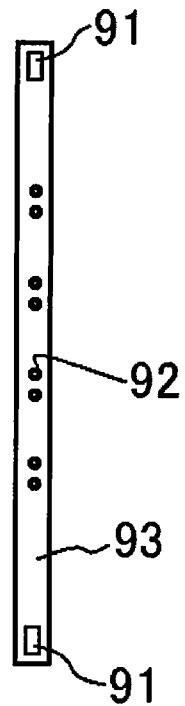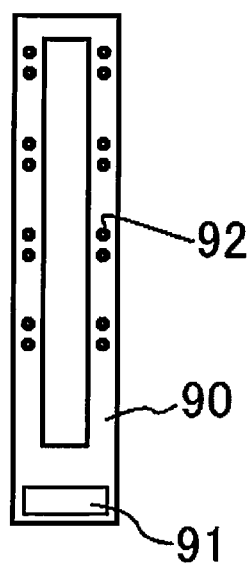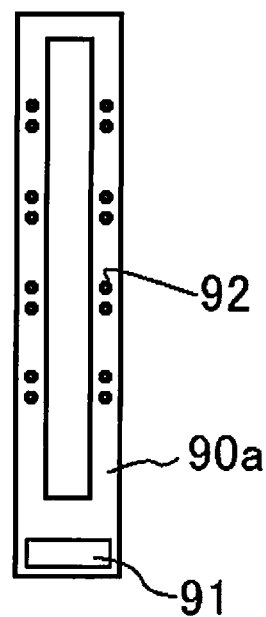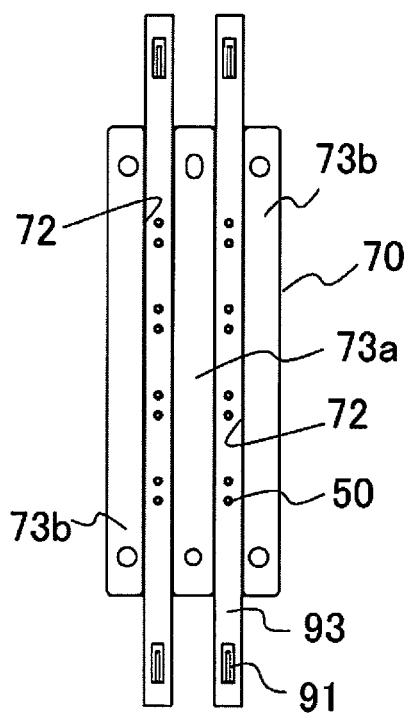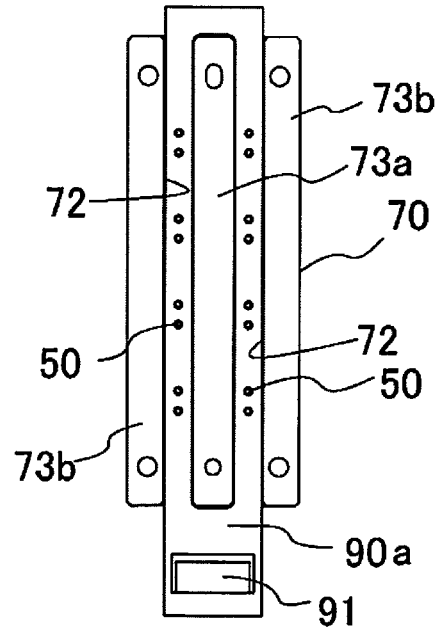

LIGHT SOURCE APPARATUS

CROSS-REFERENCE TO RELATED APPLICATION

This application claims priority to Japanese Patent Application Nos. 2013-089501, filed on Apr. 22, 2013 and 2013-150836, filed on Jul. 19, 2013 and 2014-082560, filed on Apr. 14, 2014. The entire disclosure of Japanese Patent Application Nos. 2013-089501 and 2013-150836 and 2014-082560 is hereby incorporated herein by reference.

BACKGROUND

Technical Field

The present invention is related to a light source apparatus having at least one of semiconductor laser devices.

Background Art

As apparatuses that require high luminance light sources, there conventionally are developed light source apparatuses that include light emitting diodes or laser diodes in replacement of discharge lamps.

For example, for projector use, a proposal is made of a light source apparatus including a plurality of semiconductor laser elements (for example, JP2012-9760A and JP2013-37216A).

SUMMARY

In one embodiment of the invention, a light source apparatus has at least one plurality of semiconductor laser devices and a holding member. The semiconductor laser device includes: a semiconductor laser element; a placing body on which the semiconductor laser element is mounted; a substrate on which the placing body is disposed to on one side thereof; and a pair of terminals electrically connected to the semiconductor laser element, disposed on to the other side of the substrate and protruding from the substrate. The holding member includes: holes aligned in at least a pair of rows; a thin-walled section (i.e., a thin film section) on which at least one hole is arranged, the thin-walled section being formed by providing at least a pair of depressions on the other side; and a thick-walled section provided adjacent to the thin-walled section. The semiconductor laser device is mounted on one side of the holding member and the placing body of the semiconductor laser device is disposed on the thick-walled section, and the pair of terminals are exposed through the holes from the other side of the holding member.

In other embodiment of the invention, a light source apparatus has a plurality of semiconductor laser devices and a holding member. The semiconductor laser device includes: a semiconductor laser element; a placing body on which the semiconductor laser element is mounted; a substrate on which the placing body is biased to one side thereof; and a pair of terminals electrically connected to the semiconductor laser element, biased to the other side of the substrate and protruding from the substrate. The holding member includes: holes aligned in at least a pair of rows; a thin-walled section on which the holes are arranged, the thin-walled section being formed by providing at least a pair of depressions on the other side; and a thick-walled section provided adjacent to the thin-walled section. The semiconductor laser device is mounted on one side of the holding member and the placing body of the semiconductor laser device is disposed on the thick-walled section, and the pair of terminals are exposed through the holes from the other side of the holding member.

When a plurality of semiconductor laser elements are used to serve as a high luminance light source, the semiconductor laser element may become a high temperature since they are disposed closely packed. Accordingly, various heat releasing measures are taken, however the current situation may be that no light source apparatus is developed that accomplishes a target brightness and which is sufficient in the heat releasing measures.

Under such a situation, there is a high demand for the development of a light source apparatus that uses semiconductor laser elements, which light source apparatus satisfies both brightness and heat releasing property.

The present invention is accomplished in view of the above problems, and an object thereof is to provide a high quality light source apparatus that secures sufficient heat releasing property even though a plurality of semiconductor laser elements having high output is disposed closest-packed.

BRIEF DESCRIPTION OF DRAWINGS

FIGS. 8A to 8C are plan views of a wiring substrates used in a light source apparatus of the present invention.

FIGS. 9A and 9B are rear views of a holding member to which the wiring substrate is applied to a light source apparatus of the present invention.

DETAILED DESCRIPTION

Figure 1:
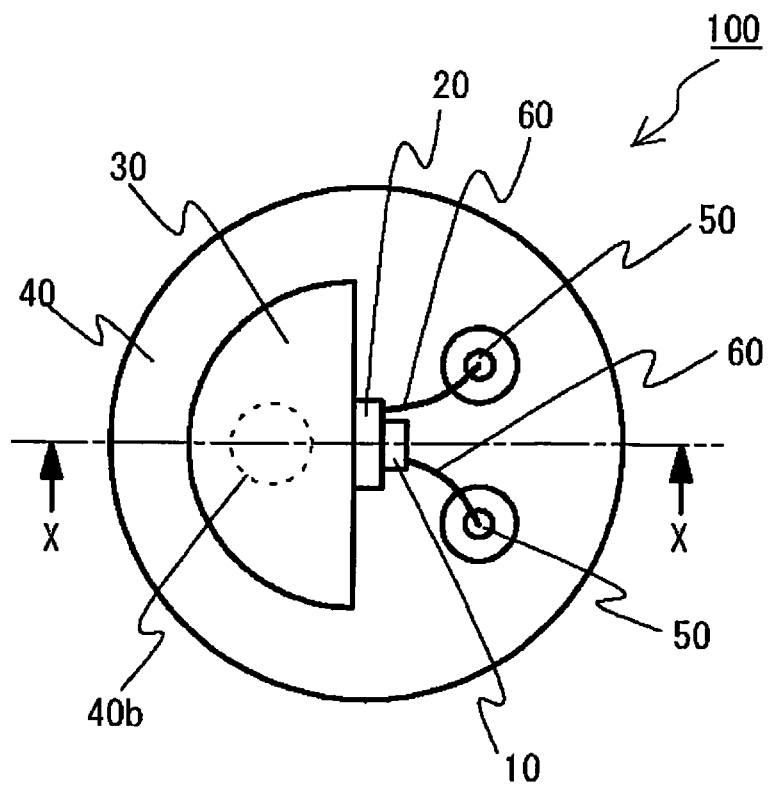
FIG. 1 is a plan view of one embodiment of a semiconductor laser device used in a light source apparatus of the present invention.

A light source apparatus according to the present embodiment includes one or a plurality of semiconductor laser devices and a holding member.

Semiconductor Laser Device

A semiconductor laser device 100 includes, as illustrated in FIG. 1 to FIG. 4, a semiconductor laser element 10, a placing body 30 on which the semiconductor laser element 10 is mounted, a substrate 40 on which the placing body 30 is mounted, and a pair of terminals 50. In the semiconductor laser device 100, although not illustrated, the semiconductor laser element 10 and like members mounted on the substrate 40 are air-tight sealed by a sealing member (for example, of a cap shape) that has a window for extracting light on a light emitting side of the semiconductor laser element 10. It is preferable that the window has a collimate lens function. That is to say, the semiconductor laser device 100 preferably is a semiconductor laser device that is integrated with a collimate lens. By having such a configuration, light emitted from the semiconductor laser device can be parallel light. Alternatively, the semiconductor laser device may be a device of a type that emits diffuse light.

Semiconductor Laser Element 10

A semiconductor laser element is not limited in particular, any known semiconductor laser elements can be used, and generally include p-electrode and n-electrode which are connected to semiconductor layers.

Examples of the semiconductor layer include III-V compound semiconductor, II-VI compound semiconductor, and various kinds of semiconductor. The semiconductor layer may include, for example, nitride semiconductor layers having a general formula of $In_xAl_yGa_{1-x-y}N$ ($0 \leq x \leq 1$, $0 \leq y \leq 1$, $0 \leq x+y \leq 1$), and InN, AlN, GaN, InGaN, AlGaN, InGaAlN or the like. The thickness of the layers and layer structure known in this field can be used.

The p-electrode and n-electrode may be positioned on the same side or different side to an active layer.

It is preferable to use as the semiconductor laser element a semiconductor laser element of a multi-mode (multi transverse mode).

The semiconductor laser element of the multi-mode has a relatively high output, and therefore the amount of heat generated is high. Accordingly, it is necessary to secure high heat releasing property. On the other hand, when a multi-mode semiconductor laser element is to be used in the light source apparatus of the present invention, high heat releasing property can be achieved in relation with a holding member or the like later described. Therefore, it is possible to stably use the light source apparatus for a long period while maintaining high output and securing high heat releasing property.

Placing Body 30

The placing body 30 is also called a heat sink, and is used to mount the semiconductor laser element 10 thereon and to release heat generated by the semiconductor laser element 10.

It is preferable that the placing body 30 is made from metal material having excellent heat releasing property. The metal material includes copper, silver, gold, aluminum and like material, and among these material, copper or copper alloy is preferable.

The size and shape of the placing body are not limited in particular. However, for example, it is preferable that the placing body has a plane area greater than that of the semiconductor laser element. Moreover, it is preferable that the placing body has a thickness thicker than the thickness of the semiconductor laser element, for example 5-fold or greater, or 10-fold or greater. Examples of the shape include a cylinder, an elliptic, a semicylinder, and a polygonal pillar (e.g., a quadrangular pillar such as a rectangular parallelepiped or cube). Among these shapes, it is preferable to be semicylindrical in consideration of the size of the target semiconductor laser device, so that any dead space created is minimized.

How the semiconductor laser element is mounted on the placing body is not limited in particular, and may be mounted in any way that is generally used in this field. For example, the semiconductor laser element can be mounted horizontally or perpendicular to the placing body (for example, FIG. 1 to FIG. 3) in consideration of a light emitting direction of the semiconductor laser element such as edge emission or surface emission.

It is preferable to mount the semiconductor laser element on the placing body by disposing an intervening body 20 (the so-called submount) between the semiconductor laser element and the placing body. The semiconductor laser element is preferably adhered to the intervening body 20 with using a solder or a silver paste. It is preferable to use for the intervening body 20 material having higher heat conductivity than that of the placing body 30. This allows for effective releasing of heat generated by the semiconductor laser element 10 to the placing body 30. Moreover, by configuring the intervening body 20 with use of an insulator such as aluminum nitride, silicon carbide, silicon, and diamond, it is possible to insulate the semiconductor laser element 10 from the placing body 30.

It is preferable to position the semiconductor laser element on the placing body in such a manner that the semiconductor laser element is biased to one side, considering that, for example, the placing body is to be mounted on a substrate 40 later described. By arranging the semiconductor laser element as such, it is possible to increase a contacting area of the placing body with the substrate, thereby allowing for effectively releasing heat to the substrate.

Substrate 40

The substrate 40 is also called a stem or an eyelet, and mounts the placing body 30 thereon.

Material for forming the substrate 40 is not limited in particular, and generally, metal material having lower heat releasing property than that of the placing body 30 is used. Examples of the metal material include, iron, aluminum, and brass. As described above, the substrate is usually connected to a sealing member of a cap form or like form for air-tight sealing, by welding or like method. Therefore, if the heat conductivity is too high the heat is diffused, thereby causing difficulty in welding.

The size and shape of the substrate is not limited in particular, it is preferable, for example, to have a plane area greater than that of the placing body. Moreover, the substrate may have a thickness thicker than the thickness of the semiconductor laser element, to a degree that the substrate secures an appropriate strength. Examples of the shape include a cylinder or a polygonal pillar (for example, a quadrangular pillar such as a rectangular parallelepiped or a cube). Among these shapes, it is preferable that the shape is cylindrical, in consideration of the size of the target semiconductor laser device, to minimize any dead space.

Figure 2:
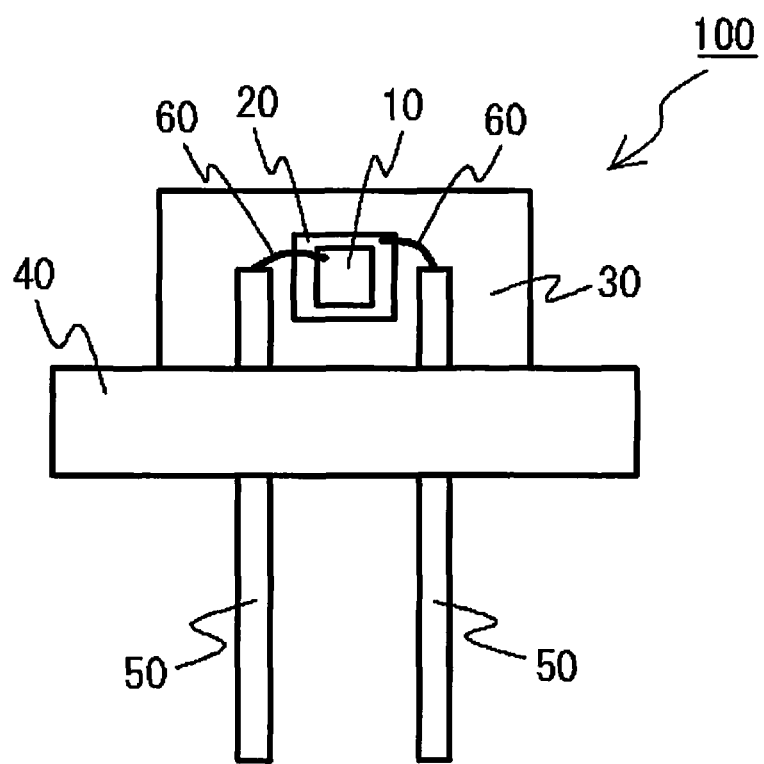
FIG. 2 is a side view of the semiconductor laser device illustrated in FIG. 1.
Figure 3:
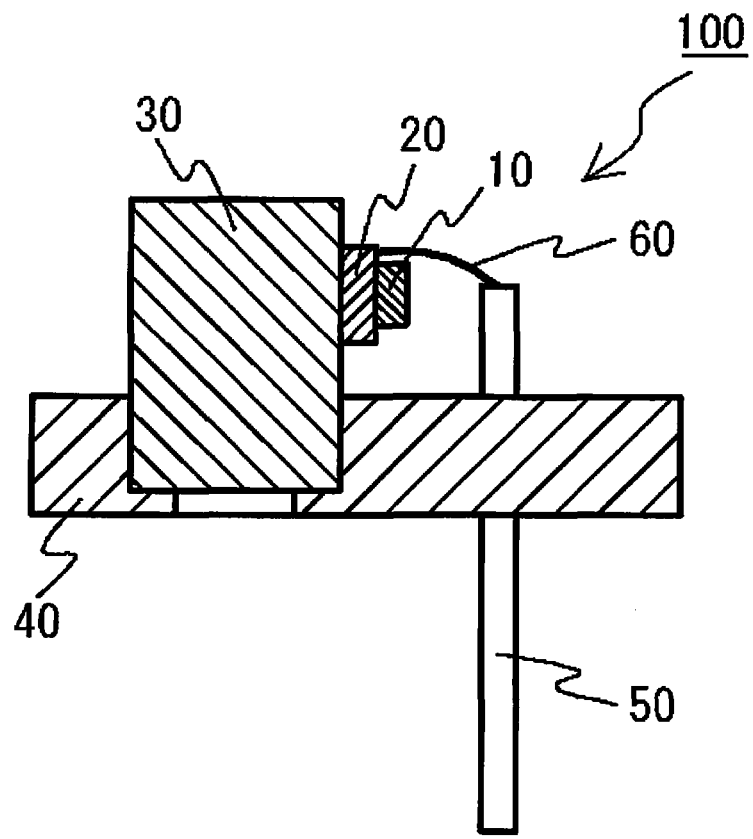
FIG. 3 is a cross sectional view taken along line X-X of FIG. 1.

How the placing body is mounted on the substrate 40 can be adjusted as appropriate depending on a light emitting direction of the semiconductor laser element. For example, it is preferable to mount the placing body 30 on the substrate 40 so that the placing body 30 is biased to one side of the substrate 40, as illustrated in FIG. 1 to FIG. 3. Here, "biased to one side" means to be arranged on a right or left or upper or lower side of a line crossing the center of the substrate 40 (hereinafter, center line). However, with respect to a line that passes through the center of the substrate 40 and that crosses at right angles to the center line, it is preferable that the placing body is arranged symmetrical either vertically or horizontally (see FIG. 1). How much the placing body is biased is not limited in particular, and the entire placing body is preferably disposed on one side, separated from the center line of the substrate. However, the placing body can be arranged so that a line passing through the center of the placing body is disposed on one side separated from the center line of the substrate.

Figure 4:
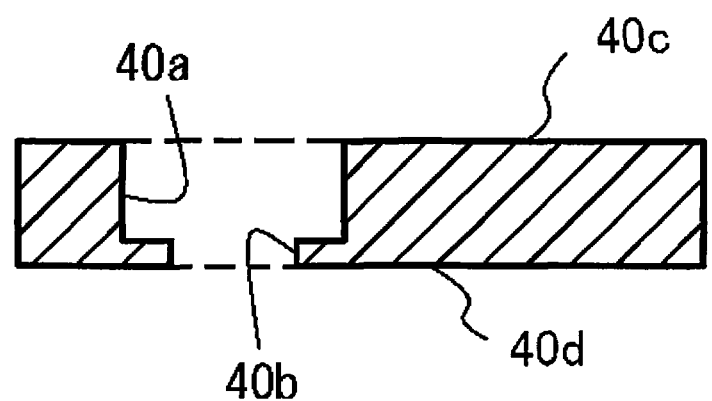
FIG. 4 is a cross sectional view of a substrate in the semiconductor laser device illustrated in FIG. 1.

The placing body can be mounted and fixed on a surface of the substrate, or one part of the placing body can be embedded into the substrate so as to be fixed and connected to the substrate. On this account, for example, as illustrated in FIG. 4, it is preferable that the substrate 40 has a depression 40a on a mounting surface (hereinafter, may be referred simply to as the surface) 40c or a through hole of the placing body 30 in accordance with the shape of the placing body 30. As a result, it is possible to increase the contacting area of the substrate 40 with the placing body 30, thereby strengthening their connection. This as a result allows for improvement in heat releasing property. Moreover, this allows for stably fixing the placing body 30, and further the semiconductor laser element 10.

The depression 40a of the substrate 40 has a depth that is not limited in particular. In consideration of securing the contacting area with the placing body 30 and of achieving firm fixing of the placing body, it is preferable to have a depth as deep as possible. For example, it is preferable to have a depth of half or more, 70% or more or 80% or more of the thickness of the substrate 40. Meanwhile, in consideration that a bottom surface of the depression 40a may bent due to a difference in thermal expansion coefficient between the substrate 40 and the placing body 30, the depth is preferably 95% or less.

When the substrate 40 has a through hole, the shape of the through hole can be of a same shape throughout the substrate in a thickness direction. In consideration of (i) securing a pathway for air to exit when fixing the placing body 30, (ii) achieving a fixing strength or preventing the placing body 30 from piercing through, and (iii) securing the contacting area of the substrate 40 with the placing body 30, it is preferable to position a through hole 40b that is smaller than the depression 40a (for example, about 5-50%) on a bottom surface of the depression 40a, as illustrated in FIG. 4. A plan shape of the through hole 40b may match the plan shape of the depression 40a, or may be any of a circle, polygon (e.g. quadrangle) or like shape. When the through hole is separated from an outer edge of the depression, it is possible to secure a pathway for the air to exit when fixing the placing body, and evenly release void included in a connection member used when fixing the placing body. Moreover, it is possible to achieve a uniform heat releasing path from the placing body.

The depression 40a or through hole 40b is formed on the substrate 40 in a method publicly known in the field, for example pressing, etching, punching process or like process.

Terminals 50

As illustrated in FIG. 1 to FIG. 3, a pair of terminals electrically connected to the semiconductor laser element is arranged biased to the other side of the substrate 40, and is each protruding from the front and back surfaces 40c and 40d of the substrate 40. Usually, the terminals 50 are fixed to the substrate 40 via an insulator. Moreover, the terminals 50 are electrically connected to electrodes of the semiconductor laser element via wires 60.

Here, "biased to the other side" has a similar meaning to the aforementioned "biased to one side", however the sides are opposite. The degree of the biasing is not limited in particular, and can be of any degree as long as the terminals are arranged on the other side separated from the center line of the substrate 40. For example, it is preferable that both terminals of the pair of terminals are arranged at a center between the center line and the edge of the substrate or in vicinity thereof. Moreover, with respect to a line that passes through the center of the substrate 40 and that intersects at right angles with the center line, it is preferable that the terminals are arranged symmetrical horizontally or vertically (see FIG. 1).

Holding Member

Figure 5:
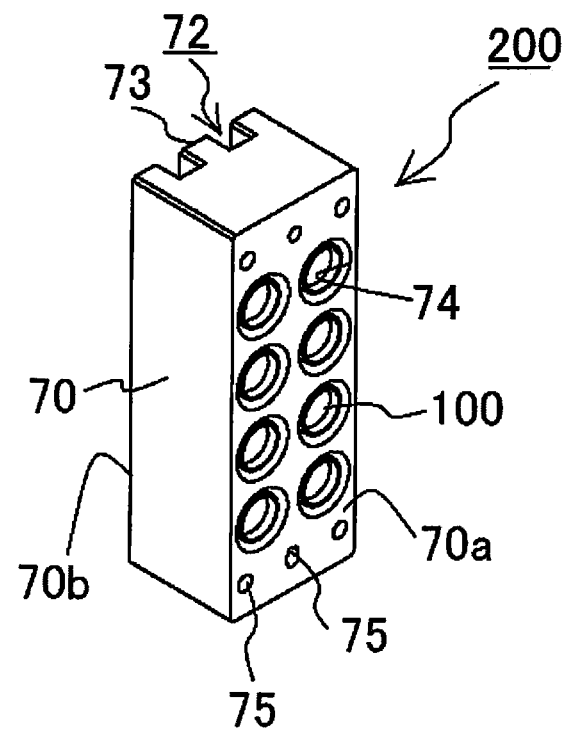
FIG. 5 is a perspective view illustrating one side of one embodiment of a light source apparatus of the present invention.
Figure 6:
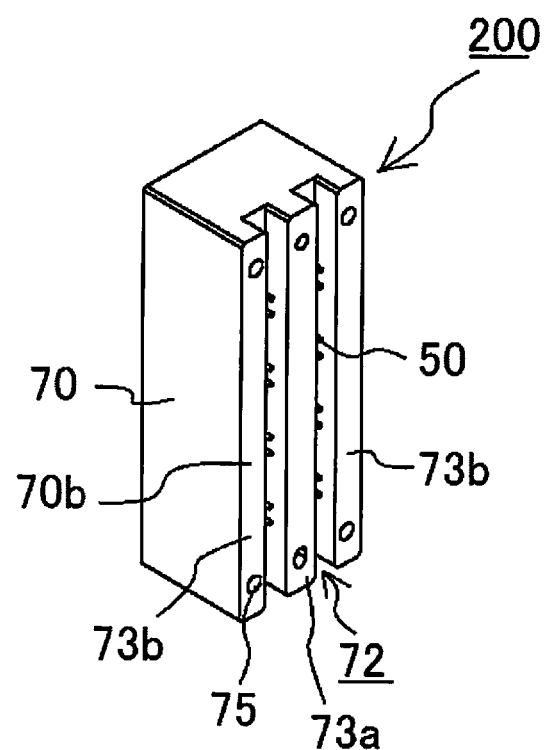
FIG. 6 is a perspective view of the other side of the light source apparatus illustrated in FIG. 5.

As illustrated in FIG. 5 to FIG. 7, a holding member 70 has (i) holes that are aligned in at least a pair of lines, (ii) a thin-walled section in which the holes are aligned and formed by having at least a pair of depressions 72 on the other side of the holding member 70, and (iii) a thick-walled section 73 provided adjacent to this thin-walled section. The holding member 70 mounts the semiconductor laser device 100 on one side thereof. Therefore, one side of the holding member 70 serves as a light emitting plane. Hereinafter, the one side of the holding member 70 may be called a surface side 70a, and the other side may be called a back side 70b.

The holding member has a plurality of semiconductor laser devices aligned in at least a pair of rows, on its surface side. The number of semiconductor laser devices aligned in one row is, for example, preferably about 2 to 10, about 2 to 5, or 4 or 5. The number of rows can be any number as long as it is one pair (2 rows) or more, for example 2 to 4 rows, or 2 or 3 rows, and 2 rows are preferred. It is preferable that the alignment of these semiconductor laser devices is made to be in regular intervals in a matrix direction.

Therefore, usually, it is preferable that the holding member is of a quadrangular shape long in a plan shape (surface shape) or a shape close to this. A brief shape thereof is preferably a pillar of a long quadrangular shape or a shape close to this shape, that is to say, a rectangular parallelepiped shape and/or a shape close to this shape. It is preferable that the long left and right side planes (see FIG. 7D) are flat. By having such a shape, it is possible to stack a plurality of holding members 70, further a light source apparatus 200 in a short direction.

Figure 7A:
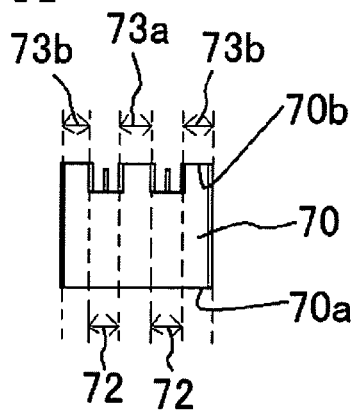
FIG. 7A illustrates a side view.
Figure 7B:
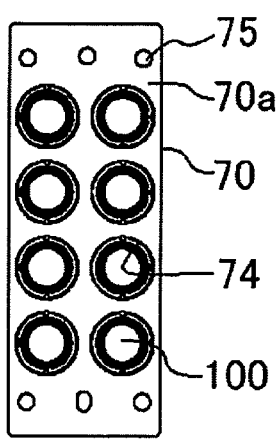
FIG. 7B illustrates a front view.
Figure 7D:
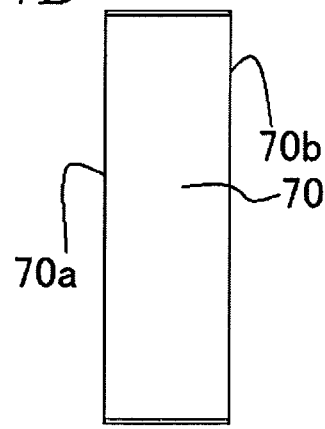
FIG. 7D illustrates left and right side views.
Figure 7C:
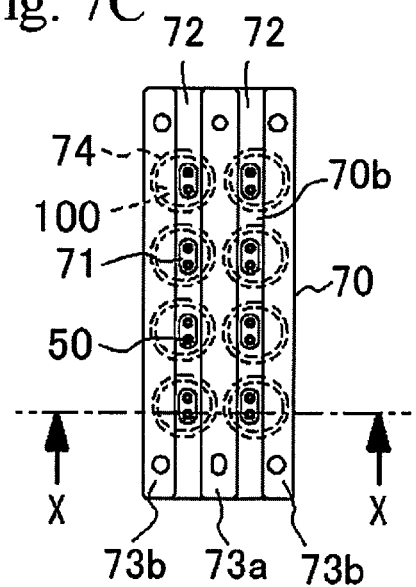
FIG. 7C illustrates a rear view.
Figure 7E:
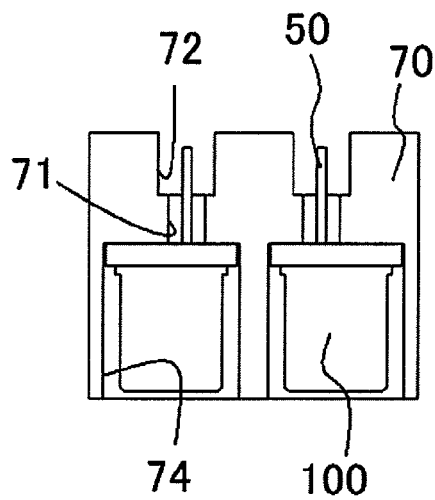
FIG. 7E illustrates a cross sectional enlarged view taken along line X-X of FIG. 7C, of the light source apparatus illustrated in FIG. 5.

The holding member 70 has holes 71 aligned in at least a pair of rows to pull out the pair of terminals 50 of the semiconductor laser devices 100 to the back side 70b of the holding member 70 (see FIGS. 7C and 7E). These holes can be made to correspond to each of the pair of terminals, it is preferable to make it one hole to draw out the pair of terminals of one semiconductor laser device together. The aligned holes 71 are made to correspond to the aforementioned number of semiconductor laser devices 100, the number of aligned rows and the aligned positions thereof.

The other side of the holding member 70 (back side 70b) has at least a pair of depressions 72 in which the aforementioned holes 71 are aligned (see FIGS. 7C and 7E). Therefore, on the back side 70b of the holding member 70, a part in which the depressions 72 are formed serves as the thin-walled section of the holding member 70.

In the depressions 72, the terminals 50 of the semiconductor laser devices 100 are drawn out through the aforementioned holes 71 aligned in rows. In other words, on the back side 70b of the holding member 70, the terminals 50 of the semiconductor laser devices 100 are exposed in the thin-walled section (i.e., within the depressions 72). The terminals 50, as described above, are arranged biased to the other side of the semiconductor laser device 100. It is preferable that tips of the terminals 50 drawn out inside the depressions 72 are arranged on an inner side of the back side 70b of the holding member 70 (see FIG. 7E). With such an arrangement, it is possible to prevent any damage to the terminals caused by unintended external force. Alternatively, the tips of the terminals 50 drawn out into the depressions 72 may be arranged on an outer side of the back side 70b of the holding member 70. With such an arrangement, a distance between an external space or an external heat releasing section is made short, thereby allowing for enhancing heat releasing property.

In the holding member 70, a part that is disposed adjacent to the thin-walled section and that does not have the aforementioned depressions 72 formed, serves as the thick-walled section 73. The thick-walled section and the thin-walled section of the light source apparatus describes a thickness direction of the holding member (direction in which one side and the other side face each other), and does not limit this member to be in a film form.

It is preferable that the depressions 72/thin-walled section and the thick-walled section 73 be arranged alternately on the back side 70b of the holding member 70, extending to both ends of the back side 70b, and be disposed in a stripe form in a parallel manner to each other.

The depressions 72 (thin-walled section) and the thick-walled section 73 each may have different widths in an extending direction (longitudinal direction), it is preferable to have the same widths. The plurality of thin-walled sections may have different widths, it is preferable to have the same widths. A plurality of thick-walled sections may have widths different from each other or may have widths that are partially different from each other, or all widths may be the same. The thin-walled section and the thick-walled section may have the same widths, it is preferable that the thin-walled section and the thick-walled section have different widths. For example, in a case in which the semiconductor laser devices are aligned in two rows, it is preferable that the width of the thick-walled section 73 (73b in FIG. 7C) that is arranged outermost of the holding member 70 is wider than the width of the depressions 72. This allows for demonstrating a further heat releasing effect, as described later.

It is preferable that the holding member is formed with metal material having good heat conductivity, and is more preferable to be made of metal material integrally formed. Examples of the metal material include silver, copper, gold, brass, and aluminum. Aluminum is preferably used among these materials since it is lightweight and cheap. By integrally forming the holding member, it is possible to reduce the contacting heat resistance as compared to those connected to a plurality of layers, thereby improving heat releasing effect thereof. Moreover, no step of forming individual layers and further stacking these layers is required. Accordingly, it is possible to simplify the manufacturing process. Furthermore, the number of components is small, therefore assembly thereof is facilitated. Moreover, the holding member can have on its exposed section that is in contact with at least the semiconductor laser device, preferably on the entire exposed section of the holding member, a plating layer made of tin, gold, palladium or like material.

It is preferable that the holding member 70 holds the semiconductor laser devices 100 on its surface side 70a so that the placing body 30 biased to one side of the semiconductor laser device 100 is positioned in the thick-walled section 73. The placing body is preferably disposed so that its entire bottom surface is arranged within the upper part of the thick-walled section, one part can be extended on the thin-walled section as long as most parts thereof is arranged within the thick-walled section. The one part in this embodiment intends to mean less than 50%, 40% or less, 30% or less, 20% or less.

With such an arrangement, the heat generated on the semiconductor laser element is radiated through the placing body and the substrate in the semiconductor laser device, and further is radiated to the holding member via the contact with the thick-walled section of the holding member. As a result, it is possible to obtain a further heat releasing effect by use of the aforementioned material and shape (thickness) of the holding member. In particular, a great heat releasing effect can be demonstrated as compared to the case in which the placing body is arranged on the holding member and the thin-walled section.

Such an effect can be achieved by having the placing body be biased to one side and having the terminals be biased to the other side, as with the aforementioned semiconductor laser device.

In other words, since the terminals are biased on the semiconductor laser device, it is possible to arrange the terminals 50 close to the center of the holding member 70 by a distance relevant to a length that the terminals are biased, in each of the rows when the semiconductor laser devices are arranged in a pair of rows on the holding member, as illustrated in FIG. 7C. Therefore, it is possible to shorten the distance between rows and to reduce the size of the light source apparatus, particularly in the shorter dimension. Alternatively, it is possible to widen the width of the thick-walled section 73b without changing the size of the light source apparatus. In addition, since the placing body is biased, it is possible to arrange the placing body away from each other in each of the rows, by a length relevant to the biased length. As a result, it is possible to arrange the placing body on the outer sides of the holding member. This allows for separating the placing bodies that generate and accumulate heat in particular, and making the placing body have contact with external space or an external heat releasing section with a greater contacting area. Consequently, it is possible to further improve the heat releasing property of the light source apparatus.

As such, as illustrated in FIGS. 7A and 7C, it is preferable that the width of the thick-walled section of the holding member 70, in particular, the width of the thick-walled section 73b on which the placing body 30 is to be arranged is greater than the width of the thin-walled section that serves as the depression 72. The difference in width is not limited in particular, and may be adjusted as appropriate based on (i) the size of the semiconductor laser device, (ii) the degree of bias of the terminals and the placing body, (iii) the size of the holding member, (iv) the size of the light source apparatus, and like aspects. For example, the difference may be about 1 to 30%, or about 15% to 25%.

As described above, it is preferable that the holding member 70 have a plurality of openings 74 opened that are aligned along an outer shape of the semiconductor laser device 100 (see FIG. 5, 7B, 7E) on the surface of the holding member, to dispose the semiconductor laser device 100. Therefore, such openings 74 are to be provided regularly in matrix in accordance with the arrangement of the semiconductor laser device 100. The openings 74 may correspond to the plane shape of the semiconductor laser device 100, the openings are preferably slightly larger than the semiconductor laser device. Moreover, the openings 74 may have a depth shallower, the same, or slightly deeper as compared to the height of the semiconductor laser device 100 other than that of the terminals 50. Alternatively, the holding member 70 may have a thickness of a degree so that the holding member 70 has its surface on the same plane as the semiconductor laser device 100 or on an outer side of the semiconductor laser device 100. This allows for achieving a further small sized light source apparatus.

By having such a shape and size, there is no need to apply pressure to or press fit the semiconductor laser device when mounting the semiconductor laser device onto the holding member, thereby avoiding any damage caused thereto by such an action. Moreover, since it is possible to appropriately secure arrangement space for a fixing/connecting member used for fixture, it is possible to connect the semiconductor laser device to the holding member efficiently and effectively. Furthermore, it is possible to compensate any thermal expansion when the members configuring the semiconductor laser device thermally expands caused by the generation of heat by the semiconductor laser element, thereby allowing for preventing the shift in position of the semiconductor laser device and the distortion of an optical axis of a laser beam. In addition, the holding member reasonably surrounds the semiconductor laser device. Therefore, it is possible to effectively make the generated heat escape to the holding member even further. When the semiconductor laser device is fixed to the holding member, the semiconductor laser device may be press fit thereto, or an adhesive or a solder having a low melting point may be used. As the solder having a low melting point, it is preferably to select materials which has a lower melting point than that of the solder or the silver paste for using to adhered to the intervening body with the semiconductor laser element.

Moreover, by making the openings be slightly deep, it is possible to arrange the semiconductor laser device on a same plane of the holding member or more inner of the plane of the holding member. This allows for protecting the semiconductor laser device from unintended external force, without the semiconductor laser device protruding from the holding member. As a result, it is possible to effectively prevent the distortion in the optical axis of an emitted laser beam.

When the holding member has an opening on its surface, it is preferable that the aforementioned holes 71 are opened inside the openings 74, as illustrated in FIG. 7E. Therefore, the holes 71 are to penetrate through the bottom surface of the openings 74, and the holes 71 connect the opening 74 with the depressions 72.

It is preferable that the holding member has a protrusion on its outer surface other than its back surface (in particular, side surface or front surface) on which the depressions are formed, as described above. By having such protrusions, it is possible to further improve the heat releasing property.

The holding member 70 has through holes 75 at edges of the thick-walled section 73 (see for example FIG. 5 and FIG. 7B). The through holes 75 in this case are used when the light source apparatus 200 is to be fixed to an external or heat releasing member or the like, and is usually used for inserting a screw or the like, and/or aligning a position. By having such through holes, it is possible to fix the light source apparatus in a state in which light source apparatuses are aligned or stacked vertically and horizontally. In particular, as described above, as long as its side surface is flat, a plurality of light source apparatuses can be stacked in a short length direction.

It is preferable that the through holes are counterboring holes. This allows for hiding a tip of the screw within the holding member. Moreover, by having the counterboring holes, it is possible to increase the surface area of the holding member and improve the heat releasing property. When the counterboring is provided, it is preferable that the tip of the screw is hidden inside the uppermost surface of the holding member, and for example can be a counterboring in which a side surface of the holding member is cut.

A holding member 77 may be a member not only for mounting a plurality of the semiconductor laser devices as the holding member 70, but also for mounting single semiconductor laser device, as illustrated in FIG. 12A to FIG. 12D.

That is to say, the holding member 77 can formed by providing one depression 72 on the other side (i.e., rear face 77b), and has a thin-walled section (72) having a hole 71 and thick-walled sections 73 provided adjacent to the thin-walled section on both sides. In other respects, the holding member 77 is substantially the same to the holding member 70. Therefore, the holding member 77 can obtain the same effect as the holding member 70.

Use of Light Source Apparatus

The light source apparatus 200 is electrically connected to for example wiring substrates 93, 90, and 90a as illustrated in FIG. 8A to 8C via the terminals 50 of the semiconductor laser device 100, which terminals are exposed inside the depression 72 of the rear surface 70b of the holding member 70, and can be used for various uses, for example in an apparatus that requires high luminance such as a projector.

The wiring substrate in the present embodiment, for example, includes a connector 91, and has holes 92 in positions corresponding to the terminals 50. As the wiring substrate, it is possible to use a rigid or flexible substrate on which wiring (not illustrated) for series connection with the semiconductor laser devices is provided per row (see FIG. 8A) or a rigid or flexible substrate on which wiring (not illustrated) for series connection of all of the semiconductor laser devices is arranged in a plurality of rows (see FIG. 8B and FIG. 8C).

It is preferable that the entirety or a part of the wiring substrates 90, 90a, and 93 are of a shape, thickness and size that fits within the depressions 72 of the holding member 70. When the entirety of the wiring substrates 90, 90a, or 93 fits inside the depressions 72 of the holding member 70, it is possible to have the entire back side 70b of the holding member 70 to be in contact with the external or heat releasing member or the like, thereby allowing for further improvement in heat releasing efficiency.

For example, illustrated in FIG. 9A is an exemplification in which two wiring substrates 93 is included in the depressions 72 of the holding member 70 respectively, and which the substrates connect four semiconductor laser devices aligned in one row in series. In this case, even if a circuit becomes in an open state as a result of malfunction in any one of the semiconductor laser devices, it is possible to drive the semiconductor laser device in a row different from the row that includes the malfunctioning semiconductor laser device.

Figure 11A:
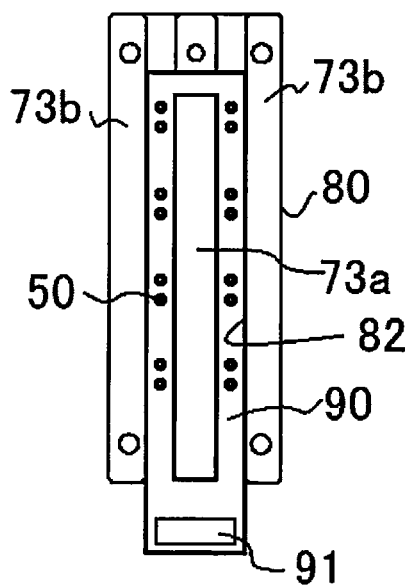
FIGS. 11A and 11B are rear views of a light source apparatus of the present invention on which a wiring substrate is mounted.
Figure 11B:
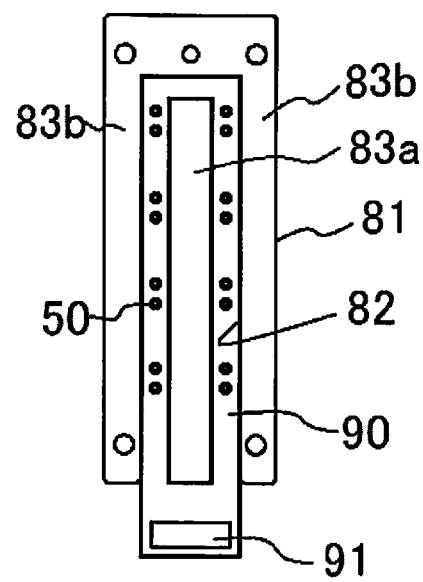
Figure 12A:
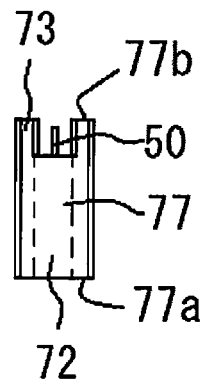
FIG. 12A illustrates a side view.
Figure 12C:
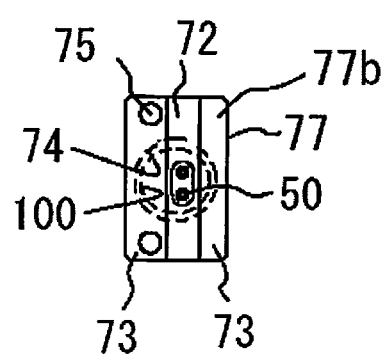
FIG. 12C illustrates a rear view.
Figure 12B:
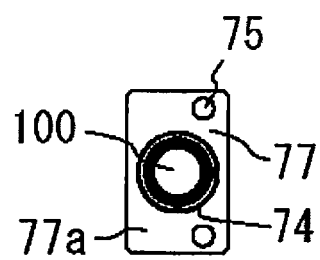
FIG. 12B illustrates a front view.
Figure 12D:
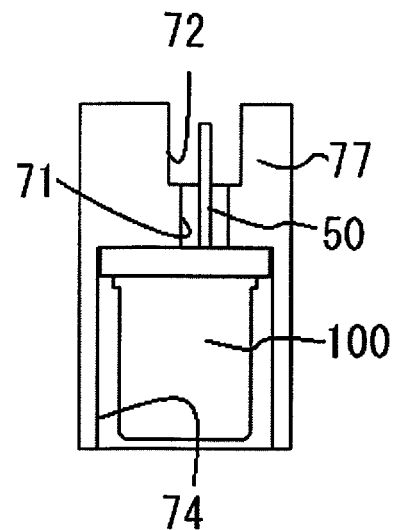
FIG. 12D illustrates a cross sectional enlarged view of the other light source apparatus.

Moreover, FIG. 9B, FIG. 11A and FIG. 11B exemplify those in which eight semiconductor laser devices arranged in two rows are connected in series via two wiring substrates 90 and 90a that are processed in shapes so as to fit inside two depressions 72 of the depressions 72 of the holding members 70, 80, and 81. In this case, the driving circuit can be made to one, thereby allowing size reduction.

Figure 10A:
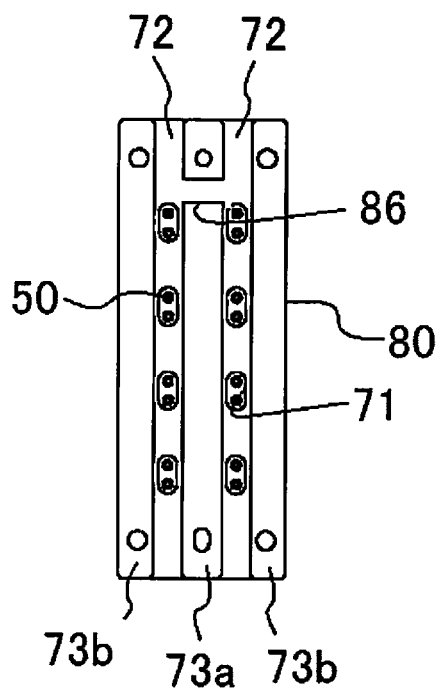
FIGS. 10A and 10B are rear views illustrating a modification of a holding member in a light source apparatus of the present invention.
Figure 10B:
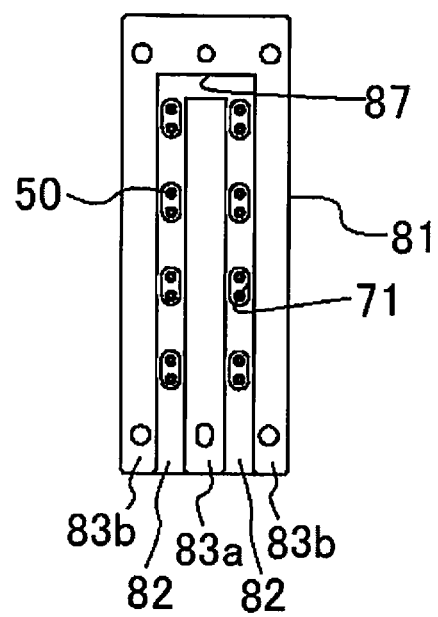

Moreover, as illustrated in FIG. 10A, a groove 86 that extends over one depression 72 to another depression 72 of the holding member 80 is provided around the edge of the holding member 80, and the wiring substrate 90 can be fit inside the groove 86, as illustrated in FIG. 11A. Alternatively, as illustrated in FIG. 10B, a groove 87 that extends across one depression 82 to another depression 82 can be formed in a U-shape on the holding member 81, and the wiring substrate 90 can be fit inside that groove 87, as illustrated in FIG. 11B.

This as a result allows for avoiding protrusion of the wiring substrates 90 and 90a from the back side of the holding members 80 and 81.

In this embodiment, for example when the through holes 75 are formed, it is preferable that the grooves 86 and 87 are formed on the inner sides of the through holes 75. This is to form the wires shorter.

INDUSTRIAL APPLICABILITY

The light source apparatus according to the present invention can be suitably employed for various lighting apparatuses such as projector, illuminating light source, a light source for various indicators, automotive light source, a light source for display, LCD Backlight light source, traffic signals, automotive parts, channel letter sign and the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light source apparatus comprising:
   a plurality of semiconductor laser devices, each of the semiconductor laser devices including
      a semiconductor laser element,
      a placing body on which the semiconductor laser element is mounted,
      a substrate on which the placing body is biased to one side thereof in a plan view, and
      a pair of terminals electrically connected to the semiconductor laser element, the pair of terminals being biased to the other side of the substrate in the plan view and protruding from the substrate; and
   a holding member having a first side surface and a second side surface that faces in an opposite direction of the first side surface, the holding member including
      a first depression on the first side surface of the holding member with a plurality of first holes aligned in a first row in the first depression,
      a thin-walled section defined between the first and second side surfaces at the first depression, and
      at least one thick-walled section defined between the first and second side surfaces and provided adjacent to the thin-walled section, wherein
   each of the semiconductor laser devices is mounted on the second side surface of the holding member such that the placing body of the semiconductor laser device overlaps the at least one thick-walled section in the plan view, and such that the pair of terminals are exposed through a corresponding one of the first holes from the first side surface of the holding member.

2. The light source apparatus according to claim 1, wherein:
   a width of the thick-walled section of the holding member on which the placing body is arranged is greater than a width of the thin-walled section.

3. The light source apparatus according to claim 1, wherein:
   the holding member is made of metal material integrally formed.

4. The light source apparatus according to claim 1, wherein:
   the semiconductor laser devices are arranged on an inner side of the second side surface of the holding member, and
   tips of the terminals are arranged on an inner side of the first side surface of the holding member.

5. The light source apparatus according to claim 1, wherein:
   the holding member has through holes at edges of the thick-walled section.

6. The light source apparatus according to claim 1, wherein:
   each of the semiconductor laser devices is provided with a respective collimate lens.

7. The light source apparatus according to claim 1, wherein:
   each of the semiconductor laser devices is fixed to the holding member with a solder having a low melting point.

8. A light source apparatus comprising:
   at least one semiconductor laser device including
      a semiconductor laser element,
      a placing body on which the semiconductor laser element is mounted,
      a substrate on which the placing body is biased to one side thereof in a plan view, and
      a pair of terminals electrically connected to the semiconductor laser element, the pair of terminals being biased to en the other side of the substrate in the plan view and protruding from the substrate; and
   a holding member having a first side surface and a second side surface that faces in an opposite direction of the first side surface, the holding member including
      a depression on the first side surface of the holding member with at least one hole disposed in the depression,
      a thin-walled section defined between the first and second side surfaces at the depression, and
      a thick-walled section defined between the first and second side surfaces and provided adjacent to the thin-walled section, wherein
   the semiconductor laser device is mounted on the second side surface of the holding member such that the placing body of the semiconductor laser device overlaps the thick-walled section in the plan view, and such that the pair of terminals are exposed through the at least one hole from the first side surface of the holding member.

9. The light source apparatus according to claim 8, wherein:
   a width of the thick-walled section of the holding member on which the placing body is arranged is greater than a width of the thin-walled section.

10. The light source apparatus according to claim 8, wherein:
    the holding member is made of metal material integrally formed.

11. The light source apparatus according to claim 8, wherein:
    the semiconductor laser device is arranged on an inner side of the second side surface of the holding member, and
    tips of the terminals are arranged on an inner side of the first side surface of the holding member.

12. The light source apparatus according to claim 8, wherein:
    the holding member has through holes at edges of the thick-walled section.

13. The light source apparatus according to claim 8, wherein:

the semiconductor laser device is a semiconductor laser device that is integrated with a collimate lens.

14. The light source apparatus according to claim 8, wherein:
the semiconductor laser device is fixed to the holding member with a solder having a low melting point.

15. The light source apparatus according to claim 8, wherein:
holes are aligned in at least a pair of rows in the holding member.

16. The light source apparatus according to claim 8, wherein:
the thin-walled section is formed by providing at least one pair of depressions in the holding member.

17. The light source apparatus according to claim 15, wherein:
a plurality of semiconductor laser devices are mounted on the holding member.

\* \* \* \* \*